(12) United States Patent
Murphy (10) Patent No.: US 7,023,370 B2
(45) Date of Patent: Apr. 4, 2006

(54) SHARED PARALLEL DIGITAL-TO-ANALOG CONVERSION

(76) Inventor: Charles Douglas Murphy, 1816 W. Wilson Ave. #3, Chicago, IL (US) 60640

( * ) Notice: Subject to any disclaimer, the term of this patent is extended or adjusted under 35 U.S.C. 154(b) by 267 days.

(21) Appl. No.: 10/084,803

(22) Filed: Feb. 28, 2002

(65) Prior Publication Data
US 2003/0160716 A1 Aug. 28, 2003

(51) Int. Cl.
H03M 1/66 (2006.01)
(52) U.S. Cl. ........................... 341/144; 341/164
(58) Field of Classification Search ............. None
See application file for complete search history.

(56) References Cited

U.S. PATENT DOCUMENTS

| | | | |
|---|---|---|---|
| 4,381,495 A * | 4/1983 | Hotta et al. ................. 341/120 |
| 4,484,178 A | 11/1984 | Lovgren et al. | |
| 4,544,911 A * | 10/1985 | Altman et al. .............. 341/118 |
| 4,872,011 A | 10/1989 | Pelgrom et al. | |
| 4,982,192 A | 1/1991 | Murooka | |
| 5,057,838 A | 10/1991 | Tsuji et al. | |
| 5,091,728 A | 2/1992 | Chang | |
| 5,148,164 A | 9/1992 | Nakamura et al. | |
| 5,162,801 A | 11/1992 | Powell et al. | |
| 5,227,783 A | 7/1993 | Shaw et al. | |
| 5,272,544 A * | 12/1993 | Sakai et al. ................. 358/445 |
| 5,283,579 A | 2/1994 | Tasdighi et al. | |
| 5,307,065 A | 4/1994 | Tokuhiro | |
| 5,426,413 A * | 6/1995 | Gulczynski ................. 341/144 |
| 5,446,457 A | 8/1995 | Ryat | |
| 5,508,702 A | 4/1996 | Estrada et al. | |
| 5,515,047 A | 5/1996 | Yamakido et al. | |
| 5,539,405 A | 7/1996 | Norsworthy | |
| 5,572,211 A * | 11/1996 | Erhart et al. ................ 341/144 |
| 5,594,438 A | 1/1997 | Panaoussis | |
| 5,600,321 A | 2/1997 | Winen | |
| 5,663,728 A | 9/1997 | Essenwanger | |
| 5,703,582 A | 12/1997 | Koyama et al. | |
| 5,703,586 A | 12/1997 | Tucholski | |
| 5,748,128 A | 5/1998 | Bruccoleri et al. | |
| 5,764,173 A | 6/1998 | Flynn | |
| 5,808,576 A | 9/1998 | Chloupek et al. | |
| 5,909,186 A * | 6/1999 | Gohringer ................. 341/120 |

(Continued)

OTHER PUBLICATIONS

Paul Horowitz and Winfield Hill, The Art of Electronics, second edition 1994, Cambridge University Press, New York. pp. 614-620 and pp. 621-641.

Primary Examiner—Jean Bruner Jeanglaude (57) ABSTRACT

A digital-to-analog converter in which a counter tracks the elapsed time since the beginning of a conversion cycle. Simultaneously, a reference analog signal such as a voltage ramp is generated. When the count reaches a stored digital number value, a sample-and-hold circuit is triggered and acquires the value of the reference analog signal. Multiple stored digital number values can be converted using multiple sample-and-hold and trigger circuits which share the counter and the reference analog signal. Such parallel digital-to-analog conversion is useful in many applications such as digital communications, image display, and shared parallel analog-to-digital conversion.

34 Claims, 3 Drawing Sheets

U.S. PATENT DOCUMENTS

| | | | |
|---|---|---|---|
| 5,920,273 A * | 7/1999 | Hirano | 341/144 |
| 6,052,074 A | 4/2000 | Iida | |
| 6,157,334 A | 12/2000 | Kimura | |
| 6,169,509 B1 | 1/2001 | Abe | |
| 6,172,634 B1 | 1/2001 | Leonowich et al. | |
| 6,297,759 B1 | 10/2001 | Lewyn | |
| 6,320,528 B1 * | 11/2001 | Michel | 341/144 |
| 6,346,901 B1 | 2/2002 | Aiura et al. | |
| 6,392,577 B1 * | 5/2002 | Swanson et al. | 341/144 |
| 6,542,105 B1 * | 4/2003 | Sakuragi | 341/164 |
| 6,559,788 B1 * | 5/2003 | Murphy | 341/164 |
| 6,724,334 B1 * | 4/2004 | Tzelnick | 341/144 |

* cited by examiner

SHARED PARALLEL DIGITAL-TO-ANALOG CONVERSION

CROSS-REFERENCE TO RELATED APPLICATIONS

The invention is related to the application PARALLEL AND SHARED PARALLEL ANALOG-TO-DIGITAL CONVERSION FOR DIGITAL IMAGING submitted as a separate application to the US PTO by Charles D. Murphy. The invention is also related to SHARED PARALLEL ANALOG-TO-DIGITAL CONVERSION submitted as a separate application to the US PTO by Charles D. Murphy.

STATEMENT REGARDING FEDERALLY SPONSORED RESEARCH OR DEVELOPMENT

Not applicable

REFERENCE TO A MICROFICHE APPENDIX

Not applicable

BACKGROUND

1. Field of Invention

The invention relates to digital-to-analog conversion, particularly to digital-to-analog conversion operations performed simultaneously with shared converter components.

2. Description of Prior Art

Digital-to-analog (D/A) conversion is the process of converting a digital number value to an analog signal value. D/A conversion is an important feature of many digital systems that control, communicate through, or otherwise interact with a non-digital environment.

Important characteristics of D/A converters include precision, number mapping, conversion range, and conversion speed. The precision of a D/A converter is often measured by the number of bits allowed for an input digital number. Four-bit converters are generally considered to be of low precision, eight-bit through twelve-bit converters are generally considered to be of moderate precision, and sixteen-bit or eighteen-bit converters are generally considered to be of high precision. Low precision D/A converters tend to have low implementation cost and can be very fast. High precision D/A converters tend to have high implementation cost and may be very slow.

The number mapping of D/A converters is usually a uniform mapping, with analog steps of equal size corresponding to each increment in digital number value. However, it is not necessarily the case that the mapping is uniform. Potential deviations include nonlinear output, non-monotonic output, scale error, and output offset.

With a uniform linear mapping, the precision and the conversion range determine the smallest output variation which can be produced by a D/A converter. Often, D/A converters are used to drive electrical, mechanical, or optical elements which require a large output range, such as radar emitters, acoustic speakers, and optical fiber lasers.

Finally, the conversion speed is the rate at which a single conversion of a digital number value to an analog signal value can be completed. The conversion speed limits the rate at which a D/A converter can be re-used for multiple conversions and may also limit the bandwidth of analog signals in the application for which the D/A converter is used.

There are several prior art techniques for D/A conversion. These typically fall into one of two classes of D/A converters, which are instantaneous converters and time-averaging converters. A discussion of the principal varieties of each class appears below, with material coming largely from the discussion in the second edition of "The Art of Electronics" by Paul Horowitz and Winfield Hill.

One simple form of instantaneous D/A conversion uses a tree of scaled resistors selectively tied to a summing junction. The summing junction is the input of an op-amp, with the op-amp output proportional to the sum of input currents at the summing junction. The current through each resistor is equal to voltage across the resistor multiplied the inverse of the resistance value. Each bit of a digital number to be converted controls the voltage applied to each resistor. The most significant bit is associated with the smallest resistor value, while the least significant bit is associated with the largest resistor value.

A major drawback to scaled resistor D/A conversion is that there must be a wide range of possible resistor values with tight tolerances on the variation allowed for large resistors. This is a particular drawback for high-precision D/A converters. A major advantage to scaled resistor D/A conversion is that the analog output is available quickly once the bits of the input number have been applied.

A second form of instantaneous D/A conversion uses a ladder of resistor values. An R-2R converter requires only two resistor values rather than a wide range of resistor values. The analog output is available immediately on application of the bits of the digital input number.

A third form of D/A conversion uses frequency-to-voltage (F/V) conversion. A F/V converter is most useful when the digital input comprises a train of digital pulses rather than, for instance, a binary twos-complement number representation. The digital pulses are converted directly to analog values by averaging them using a low-pass filter. The averaging requires some time, so the analog output of the D/A converter is not available immediately.

A fourth type of D/A converter uses pulse width modulation (PWM). In such a converter, the digital input is used to adjust the duty cycle of a pulse generator. For instance, a digital input number can be compared to an increasing count. As long as the count is less than the digital input number, a comparator output is in a high state. Once the count is greater than the digital input number, the comparator output falls to a low state. The counting process is repeated for each pulse cycle. To generate the analog output, the comparator output is averaged over one or more pulse cycles.

A fifth type of D/A converter uses an averaged rate multiplier circuit. A rate multiplier produces a sequence of digital pulses at a rate that is, on average, a multiple of a known base rate. The pulses are not necessarily periodic, which means that their rate must be averaged in order to produce the desired analog output. Typically, an averaged rate multiplier D/A converter relies on the load it is driving for the averaging.

A general drawback to all of the prior art D/A converters discussed above is that they accept one digital number value as input and produce one analog signal value as output. To perform more than one conversion, these D/A converters can be re-used in a serial manner, or else they can be replicated with the replicas used separately in parallel.

There are many applications in which it may be desired to perform large numbers of D/A conversions very quickly. An example is image display. Consider a display array comprising 640 by 480 display elements, each of which should have a brightness with 8-bit precision. Displaying one image on the display array requires 307200 D/A conversions. If the display array is used to show a video at 30 frames per second, the array requires 9216000 D/A conversions per second. Suitable D/A converters, if they were few in number, would have to be very fast, or, if they were slow, would have to be large in number.

SUMMARY

The present invention is a digital-to-analog conversion technique in which a counter indicates elapsed conversion time in conjunction with a time-varying analog reference signal. A multiplicity of digital number comparators trigger sample-and-hold circuits which acquire analog signal levels when digital number values match the count. The invention thus permits parallel D/A conversion with shared circuitry.

OBJECTS AND OBJECTIVES

There are several objects and objectives of the present invention.

It is an object of the present invention to provide a novel D/A conversion technique based on single-slope integration, a technique heretofore used for analog-to-digital conversion.

It is another object of the present invention to allow parallel D/A conversion of multiple digital number values to multiple analog signal values during a single conversion cycle.

It is still another object of the present invention to reduce the cost of D/A conversion by sharing circuitry among multiple converters operating simultaneously.

It is another object of the present invention to provide a D/A converter which can be used in parallel implementations of analog-to-digital converters based on successive approximation.

It is another object of the present invention to enable simple circuitry for D/A conversion that can be designed as a standard block. The standard block can be replicated to create a D/A converter array.

It is still another object of the present invention to reduce the speed requirements of a D/A converter by implementing parallel conversion of a block of digital number values rather than serial conversion of the digital number values.

Further objects and advantages of the invention will become apparent from a consideration of the ensuing description.

DRAWING FIGURES

In the drawings, closely related figures have the same number but different alphabetic suffixes.

REFERENCE NUMERALS IN DRAWINGS 2 a digital clock
4 a first counter
6 a first count
8 a first digital comparator
10 a first digital number value
12 a first digital register
14 a first digital comparator output
16 a first sample-and-hold circuit
18 a first analog reference source
20 a first analog reference signal
22 a second digital register
24 a second digital number value
26 a second digital comparator
28 a second digital comparator output
30 a second sample-and-hold circuit
32 a second counter
34 a second count

Description—D/A and A/D Conversion

Digital-to-analog (D/A) and analog-to-digital (A/D) conversion are important techniques for connecting digital computing devices with the non-digital world. Various D/A converters techniques are discussed above. Briefly, their main disadvantage is that they process one digital number value input at a time, producing one analog signal value at a time as output. Some D/A converters provide instantaneous outputs, while others rely on time averaging of digital pulse trains. High-precision D/A converters, which might be desirable for some applications, tend to have a much slower conversion speed than D/A converters of low or moderate precision.

A/D converters perform the reverse conversion operation. An analog input to an A/D converter results in a digital number value as output. One type of A/D converter, which is discussed in "The Art of Electronics" along with the D/A converters above, is successive approximation. In successive approximation, a digital number value output is identified by searching through a set of possible outputs. At each stage of the process, a digital number value is passed as input to a D/A converter, the output of which is compared to the analog input being converted. On the basis of a comparator output, a next possible digital number value is selected. The D/A converter output successively approximates the analog input to the A/D converter until the digital number value desired for the A/D converter output is found.

In a related patent application entitled PARALLEL AND SHARED PARALLEL ANALOG-TO-DIGITAL CONVERSION FOR DIGITAL IMAGING, the author of the present invention proposed a technique in which A/D conversion for multiple sensor array analog outputs is performed in parallel. The parallel A/D converters shared circuitry rather than using entirely separate circuitry. In the context of digital imaging, shared circuitry enables vast savings of resources such as power consumption and chip space in implementations of the shared A/D conversion technique.

In a particular embodiment of the invention, a counter keeps track of an elapsed time during which sensor outputs are allowed to change. Once a sensor output reaches a threshold voltage, a comparator triggers recording of the count. The counter can be shared among multiple sensors.

It was noted in the application that one example of prior art A/D conversion was the use of single-slope integration.

A single-slope integration A/D converter, as discussed in "The Art of Electronics" and in PARALLEL AND SHARED PARALLEL ANALOG-TO-DIGITAL CONVERSION FOR DIGITAL IMAGING, compares a voltage ramp to a held analog input voltage while a counter keeps track of elapsed time. When the voltage ramp reaches the held analog input voltage, a comparator disables the counter, producing the digital number value desired as output.

Description—The Preferred Embodiment of the Invention

The preferred embodiment of the invention is a machine used for digital-to-analog conversion comprising a first count provided by a first counter, a first analog reference signal provided by a first analog reference source, and a first digital number value that is to be converted to a first analog value. The preferred embodiment also includes means for causing the first count to change as a function of time, means for causing the first analog reference signal to change as a function of time, means for detecting when the first count reaches the first digital number value, and means for recording the value of the first analog reference signal as the first analog value when the first count reaches the first digital number value.

In practice, the first count is incremented periodically, and the first analog reference signal has a value which corresponds to the first count at any given time. For instance, with a uniform mapping of digital number values to analog values, the count could begin at a lowest allowed value and increase. Simultaneously, the first analog reference signal could ramp up from the lowest allowed analog value. When the detecting means detects that the first count reaches the digital number value to be converted, it triggers recording of the first analog reference signal value.

The preferred embodiment of the invention with a periodic count and a uniform number mapping is similar to single-slope integration A/D conversion. However, instead of an analog input level compared to an analog reference ramp with the comparator output triggering recording of a digital count, a digital input level is compared to a digital reference count with the comparator output triggering recording of an analog signal value.

Description—Alternative Embodiments of the Invention

In an alternative embodiment of the invention, there is a second digital number value to be converted to a second analog value, means for detecting when the first count reaches the second digital number value, and means for recording the value of the analog output signal at this time as the second analog value. Thus, the invention can include shared circuitry, namely that of the first counter and the means for causing the first count to change.

Figure 1:
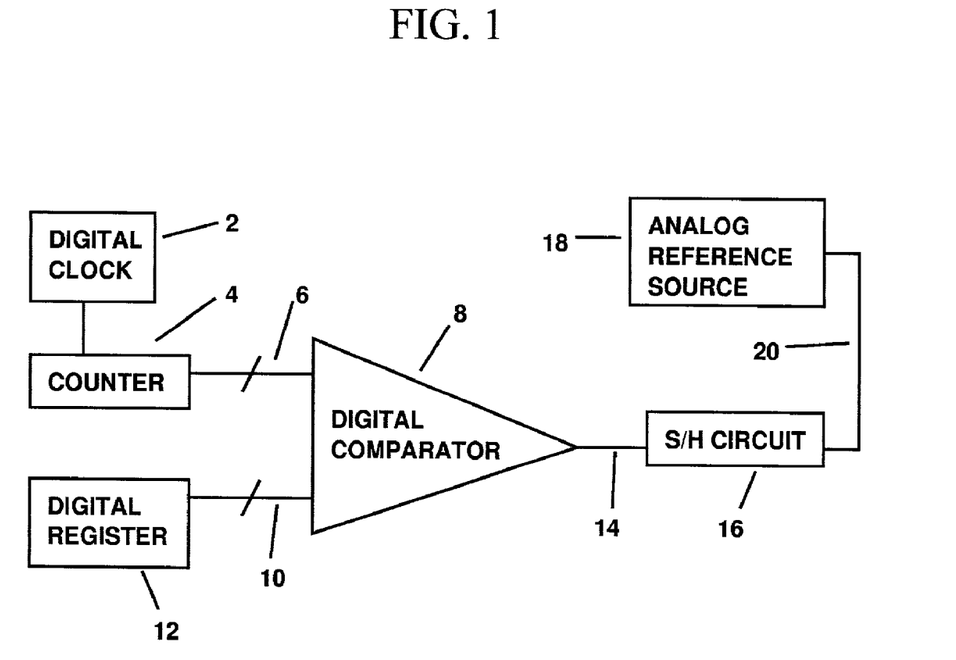
FIG. 1 shows an embodiment of the invention with a digital clock, a counter, a digital register, a digital comparator, an analog reference source, and a sample-and-hold circuit, for converting a digital number value to an analog signal value.

Description—FIG. 1

FIG. 1 shows an embodiment of the invention implementing a single D/A conversion. The figure includes a digital clock 2 which governs a first counter 4. First counter 4 provides first count 6 as an input to first digital comparator 8. The other input to first digital comparator 8 is a first digital number value 10 which is stored in a first digital register 12. Note that first count 6 and first digital number value 10 may each have multiple representation elements such as bits or digits.

First digital comparator 8 has first digital comparator output 14, which is a control signal for first sample-and-hold circuit 16. Analog reference source 18 provides an analog reference signal 20 which is time-varying and which is passed as an input to sample-and-hold circuit 16.

To perform the D/A conversion, the desired input is stored in first digital register 12, which provides first digital number value 10 to first digital comparator 8. Then, first counter 4 begins counting, while analog reference source 18 provides a time-varying output which is analog reference signal 20. For instance, first count 6 could begin at a value of zero, and increment upward, while analog reference signal 20 begins at a value of zero and increases linearly with time.

The circuitry of first digital comparator 8 determines whether first count 6 is equal to first digital number value 10. When the two values are equal, first digital comparator output 14 triggers first sample-and-hold circuit 16 to sample and hold the analog value of analog reference signal 20.

In an alternative embodiment of the invention which uses the same basic layout of FIG. 1, an input digital number value to be converted to an analog output value is loaded into first counter 4 as an initial value of first count 6. First digital register 12 holds as first digital number value 10 a first digital threshold value. Digital clock 2 controls the change of first count 6, while analog reference source 18 provides time-varying analog reference signal 20. First digital comparator output 14 triggers acquisition of the value of analog reference signal 20 by sample-and-hold circuit 16 when first count 6 reaches first digital number value 10.

FIG. 1 as first described above implements a form of D/A conversion that is analogous to the single-slope A/ID conversion technique described in "The Art of Electronics". FIG. 1 as second described above implements a form of D/A conversion that is analogous to the discharge cycle in the dual-slope A/D conversion technique described in "The Art of Electronics". However, neither operation of the circuits in figure one appears to result in savings of required resources, mainly because only one conversion is performed with the circuits shown.

Figure 2:
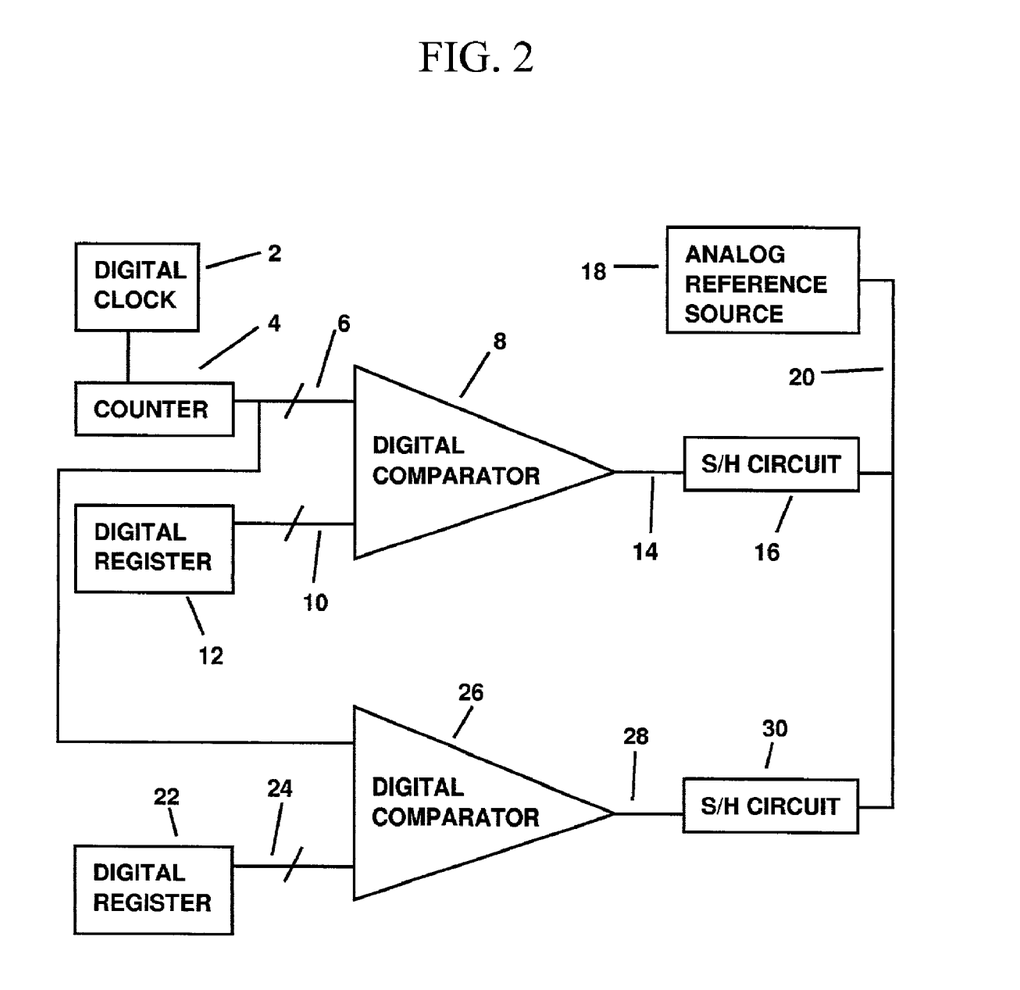
FIG. 2 shows an embodiment of the invention with a digital clock, a counter, two digital registers, two digital comparators, an analog reference source, and two sample-and-hold circuits, for converting two digital number values to two analog signal values.

Description—FIG. 2

FIG. 2 shows an extension of the D/A converter of FIG. 1 to simultaneous conversion of two digital number values to corresponding analog signal values. FIG. 2 includes all of the circuitry of FIG. 1, but in addition has a second digital register 20 which provides a second digital number value 24 as an input to a second digital comparator 26. The other input of second digital comparator 26 is first count 6. The second digital comparator 26 has a second digital comparator output 28 which is a control signal for a second sample-and-hold circuit 30. As an analog input, second sample-and-hold circuit 30 has analog reference signal 20.

To perform the two conversions, first digital number value 10 is stored in first digital register 12 and second digital number value 24 is stored in second digital register 22. Then, first counter 4 begins counting, while analog reference source 18 provides a time-varying output which is analog reference signal 20.

The circuitry of first digital comparator 8 determines whether first count 6 is equal to first digital number value 10. When the two values are equal, first digital comparator output 14 triggers first sample-and-hold circuit 16 to sample and hold the analog value of analog reference signal 20. Likewise, the circuitry of second digital comparator 26 determines whether first count 6 is equal to second digital number value 24. When the two values are equal, second digital comparator output 28 triggers second sample-and-hold circuit 30 to sample and hold the analog value of analog reference signal 20.

In the embodiment of the invention shown in FIG. 2, two conversions share first counter 4 with its output first count 6, and also analog reference source 18 with its output analog reference signal 20. It is possible to perform more than two conversion with these elements shared. Another useful feature of the embodiment of the invention in FIG. 2 is that first digital register 12, first digital comparator 8, first sample-and-hold circuit 16, and their interconnections can be structurally identical to second digital register 22, second digital comparator 26, second sample-and-hold circuit 30, and their interconnections. Thus, massively parallel shared D/A conversion circuitry is very easy to create.

Figure 3:
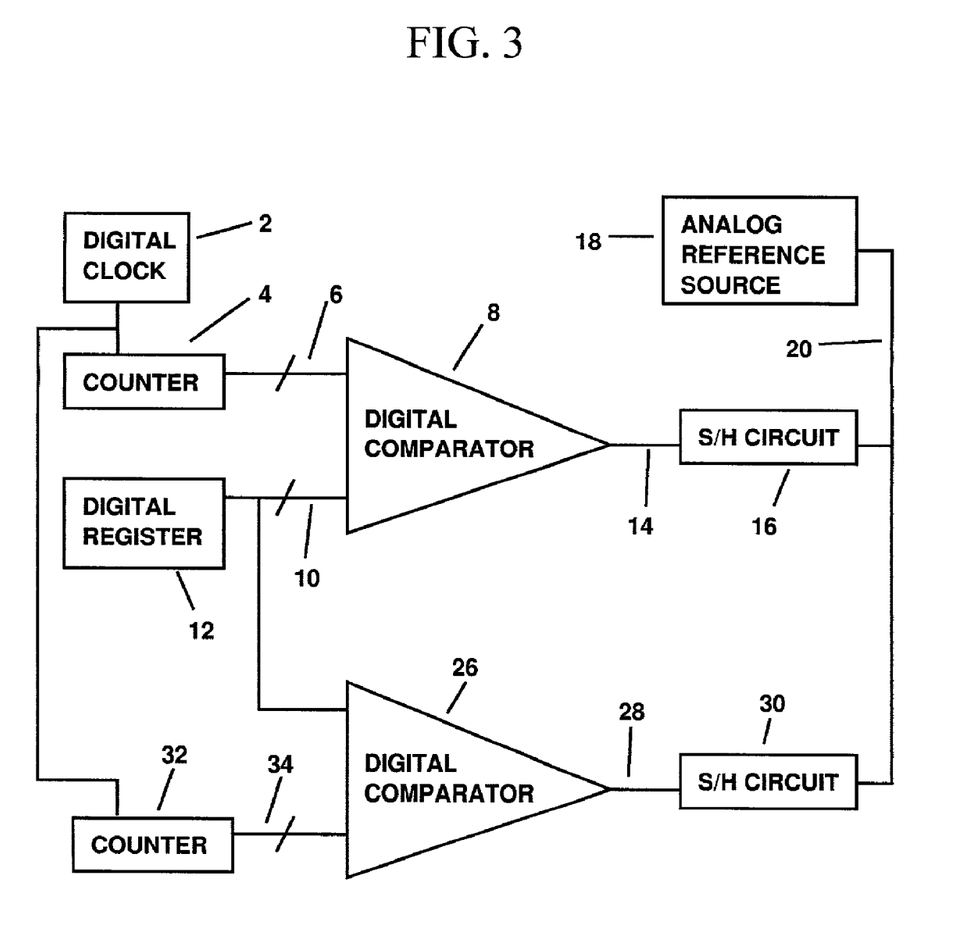
FIG. 3 shows an embodiment of the invention with a digital clock, two counters, two digital comparators, an analog reference source, and two sample-and-hold circuits, for converting two digital number values to two analog signal values.

Description—FIG. 3

In FIG. 2, the digital number values that were inputs to the D/A converter were stored in digital registers, analogous to the storage of analog inputs to a single-slope integrating A/D converter in a sample-and-hold circuit. However, it is not necessary to hold the digital numbers constant.

Consider the technique of double-slope integrating A/D conversion. In this technique, an analog input charges a capacitor for a fixed period of time, resulting in a voltage proportional to the analog input. Then, the charge is drawn off using a known current source, and the time required for the voltage across the capacitor to be restored to its original value is recorded as the A/D converter output.

FIG. 3 shows a circuit for parallel conversion of two digital number values to two analog signal values. The embodiment of the present invention in FIG. 3 includes a first digital clock 2 which governs both a first counter 4 and a second counter 32. The output of first counter 4 is a first count 6, which is an input to first digital comparator 8. The output of second counter 32 is a second count 34 which is an input to second digital comparator 26.

First digital comparator 8 has a first digital comparator output 14 which controls a first sample-and-hold circuit 16, and second digital comparator 26 has a second digital comparator output 28 which controls a second sample-and-hold circuit 30. Both first sample-and-hold circuit 16 and second sample-and-hold circuit 30 have as inputs analog reference signal 20, which is provided by analog reference source 18.

A first digital register value 12 provides a second digital number value 10 as an input to both first digital comparator 8 and second digital comparator 26. In operation, a first digital number value to be converted to a first analog value is loaded as an initial value of first count 6 in first counter 4, while a second digital number value to be converted to a second analog value is loaded as an initial value of second count 34 in second counter 32. Then, digital clock 2 causes first count 6 and second count 34 to decrement, while analog reference source 18 provides a time-varying analog reference signal 20.

First digital comparator 8 compares changing first count 6 to second digital number value 10 provided by first digital register 12. When first count 6 reaches second digital number value 10, first digital comparator output 14 triggers first sample-and-hold circuit 16 to sample and hold the value of analog reference signal 20. Simultaneously, second digital comparator 26 compares changing second count 34 to second digital number value 10. When second count 34 reaches second digital number value 10, second digital comparator output 28 triggers second sample-and-hold circuit 30 to sample and hold the value of analog reference signal 20.

In other words, the two conversion measure the time required for first count 6 and second count 34 to reach second digital number value 10. A particularly useful value of second digital number value 10 is the value zero. With such a value, there is no need for second digital register 12 or for interconnections between this register and the digital comparators. The digital comparators themselves can be simple logic gates which detect when all of the input lines of the changing input counts reach the values corresponding to zero. Since a common representation of zero is all logic values being logical low, the digital comparators can be implemented with a logical AND operation on all the bus lines of each count.

Description—Other Embodiments

It is possible to design other D/A circuits that share one or more components. For instance, D/A circuits that a counter can be used to implement parallel pulse-width modulated D/A converters. A first digital comparator could compare a changing first count to a held first digital number value, while a second digital comparator could compare the changing first count to a held second digital number value. Each digital comparator output could be averaged to produce the corresponding desired analog output.

In an alternative embodiment, the invention can be used as part of a parallel successive-approximation A/D converter. The parallel A/D converter would convert multiple analog values to multiple digital number values. During each cycle of successive approximation, the embodiment of the invention would provide shared parallel D/A conversion of multiple digital number values to multiple analog values, which would then be compared with the A/D inputs during the next cycle. The invention could also be used as part of other types of A/D converters such as half-flash A/D converters.

In another alternative embodiment, a digital clock signal driving the counter or counters can have variable frequency, whereby D/A conversions of differing precision can use the same circuitry without requiring the clock to constantly operate at its highest frequency. This could result in power savings. A variable-frequency digital clock also allows control of the mapping between digital input numbers and analog output levels, without any change in the analog reference source. Thus a precise, stable analog reference source can be used rather than one which must be able to vary the properties of the variation in the analog reference signal.

In still another embodiment, there are means for causing both the first count and the first digital number value to change as a function of time. The detecting means determines when the time-varying first count reaches the time-varying digital number value. The recorded value of the analog reference signal then measures the time required for the difference between the two time-varying digital quantities to reach zero. The idea of having both a digital input to be converted and a digital reference that change with time can be extended to the embodiments of the invention with multiple inputs to be converted.

CONCLUSION, RAMIFICATIONS, AND SCOPE

The reader will see that the present invention has several advantages over prior art techniques for D/A conversion.

Using the present invention, it is possible to implement massively-parallel D/A conversion in which converter components are shared, resulting in reduced implementation cost. Simple circuitry can be easily scaled, making massively-parallel design a matter of making a single converter circuit and replicating non-shared parts. Another benefit of parallel D/A conversion is allowing high-speed processing systems which do not require high-speed converters.

The invention is particularly useful in applications where there are multiple digital numbers to be converted to analog values. An example of such an application is image display, in which parallel picture elements or pixels form the image. The pixels may be driven so as to produce analog signals. Another example is in communications, either analog or digital. In communications, an analog signal conveys information from a transmitter to a receiver. The analog signal must conform to particular requirements as to shape and frequency components. Another example is in shared parallel A/D conversion using successive approximation, with a D/A converter implemented according to the present invention being a part of several parallel A/D conversion circuits.

The description above contains many specific details relating to A/D conversion techniques, D/A conversion techniques, precision, conversion times, circuit design, conversion rates, sample-and-hold circuits, digital comparators, digital registers, counters, and applications. These should not be construed as limiting the scope of the present invention, but as illustrating some of the presently preferred embodiments of the invention. The scope of the invention should be determined by the appended claims and their legal equivalents, rather than by the examples given.

I claim:

1. A machine used for digital-to-analog conversion, comprising:
   a. a first counter which provides a first count
   b. a first analog reference source which provides a first analog reference signal
   c. a first digital number value to be converted to a first analog value
   d. means for causing said first count to change as a function of time
   e. means for causing said first analog reference signal to change as a function of time
   f. means for detecting when said first count reaches said first digital number value
   g. means for recording the value of said first analog reference signal as said first analog value when said first count reaches said first digital number value
   whereby said first analog value is the converted value of said first digital number value.

2. The machine of claim 1 in which said first analog reference source comprises a first current source charging a first capacitor, whereby said means for causing said first analog reference signal to change as a function of time is said first current source and whereby said first analog reference signal is a voltage across said first capacitor.

3. The machine of claim 1 wherein said means for causing said first count to change as a function of time is a first digital clock.

4. The machine of claim 3 in which said first digital clock is a variable-frequency digital clock, whereby said first count need not always change at a single rate, whereby high-precision digital-to-analog conversion is possible with a high frequency of said first digital clock, a high rate of change of said first count, and a corresponding high dynamic power consumption and low-precision digital-to-analog conversion is possible with a low frequency of said first count, and a corresponding low power dynamic power consumption.

5. The machine of claim 1 in which said first analog reference source comprises a voltage ramp.

6. The machine of claim 1 in which said first analog reference source comprises an operational amplifier.

7. The machine of claim 1 in which said first analog reference source comprises a first digital-to-analog converter, whereby said first count can be the input to said first digital-to-analog converter and whereby said first analog reference signal can be the output of said first digital-to-analog converter.

8. The machine of claim 1 wherein said means for detecting when said first count reaches said first digital number value is a first logic circuit:
   a. said first logic circuit providing a first logic circuit output value when said first count is not equal to said first digital number value
   b. said first logic circuit providing a second logic circuit output value when said first count is equal to said first digital number value
   c. said first logic circuit output value not being the same as said second logic circuit output value
   whereby simple logical operations such as layered XNOR and AND operations can be used to make a digital comparator as said means for detecting when said first count reaches said first digital number value in said first logic circuit.

9. The machine of claim 1 wherein said means for recording the value of said first analog reference signal as said first analog value is a first sample-and-hold circuit.

10. The machine of claim 1 in which said first count controls said first analog reference source, whereby said first count need not be in increasing order or in decreasing order.

11. The machine of claim 1 in which said first count does not control said first analog reference signal, whereby said first count should be in increasing order or in decreasing order with said first analog reference signal level changing correspondingly.

12. The machine of claim 1 further including:
   a. a second digital number value to be converted to a second analog value
   b. means for detecting when said first count reaches said second digital number value
   c. means for recording the value of said first analog reference signal as said second analog value when said first count reaches said second digital number value
   whereby said first analog value and said second analog value are recorded from said first analog reference signal when said first count corresponds to said first digital number value and said second digital number value respectively, whereby parallel digital-to-analog conversion is implemented with said first counter and said first analog reference signal both being shared.

13. The machine of claim 12 in which:
   a. said means for recording the value of said first analog reference signal as said first analog value when said first count reaches said first digital number value is a first sample-and-hold circuit
   b. said means for recording the value of said first analog reference signal as said second analog value when said first count reaches said second digital number value is a second sample-and-hold circuit
   whereby separate sample-and-hold circuits are used to record said first analog value and said second analog value.

14. The machine of claim 12 wherein:
a. said means for detecting when said first count reaches said first digital number value is a first logic circuit:
   i. said first logic circuit providing a first logic circuit output value when said first count is not equal to said first digital number value
   ii. said first logic circuit providing a second logic circuit output value when said first count is equal to said first digital number value
   iii. said first logic circuit output value not being the same as said second logic circuit output value
b. said means for detecting when said first count reaches said second digital number value is a second logic circuit:
   i. said second logic circuit providing a third logic circuit output value when said first count is not equal to said second digital number value
   ii. said second logic circuit providing a fourth logic circuit output value when said first count is equal to said second digital number value
   iii. said third logic circuit output value not being the same as said fourth logic circuit output value
whereby simple logical operations such as layered XNOR and AND operations can be used to make a digital comparator as said means for detecting when said first count reaches said first digital number value in said first logic circuit and as said means for detecting when said first count reaches said second digital number value in said second logic circuit.

15. The machine of claim 14 in which:
a. said first logic circuit output value is the same value as said third logic circuit output value
b. said second logic circuit output value is the same value as said fourth logic circuit output value
whereby said first logic circuit and said second logic circuit can have identical structures, allowing a standard design for logic circuits used as digital comparators.

16. The machine of claim 12 in which said second digital number value has a different number of representation elements than said first digital number value, whereby digital-to-analog conversion of said first digital number value to said first analog value and digital-to-analog conversion of said second digital number value to said second analog value can have differing precision, but can still share circuitry such as said first counter.

17. The machine of claim 1 further including:
a. a second analog reference source which provides a second analog reference signal
b. a second digital number value to be converted to a second analog value
c. means for causing said second analog reference signal to change as a function of time
d. means for detecting when said first count reaches said second digital number value
e. means for recording the value of said second analog reference signal as said second analog value when said first count reaches said second digital number value
whereby said first analog value and said second analog value are recorded from said first analog reference signal and from said second analog reference signal when said first count corresponds to said first digital number value and when said first count corresponds to said second digital number value respectively, whereby parallel digital-to-analog conversion is implemented with said first counter being shared.

18. The machine of claim 17 in which said first analog reference signal and said second analog reference signal have different values, whereby digital-to-analog conversion of said first digital number to said first analog value and digital-to-analog conversion of said second digital number to said second analog value have differing conversion mappings from digital numbers to analog values.

19. The machine of claim 1, further including means for causing said first digital number value to change as a function of time, whereby said first analog value is the converted value of said first digital number value prior to its change with time, and represents the time required for the difference between the time-varying first count and the time-varying first digital number value to reach zero.

20. A machine used for digital-to-analog conversion, comprising:
a. a first counter which provides a first count
b. means for initializing said first count to a first digital number value
c. a first analog reference source which provides a first analog reference signal
d. means for causing said first count to change as a function of time
e. means for causing said first analog reference signal to change as a function of time
f. means for detecting when said first count reaches a first digital threshold value
g. means for recording the value of said first analog reference signal as a said first analog value when said first count reaches said first digital threshold value
whereby said first analog value is the converted value of said first digital number value.

21. The machine of claim 20 further including:
a. a second counter which provides a second count
b. means for initializing said second count to a second digital number value
c. means for causing said second count to change as a function of time
d. means for detecting when said second count reaches a second digital threshold value
e. means for recording the value of said first analog reference signal as a said second analog value when said second count reaches said second digital threshold value
whereby said first analog value is the converted value of said first digital number value and whereby said second analog value is the converted value of said second digital number value.

22. The machine of claim 21 in which said first digital threshold value is the same as said second digital threshold value.

23. The machine of claim 22 in which said first digital threshold value is equal to zero.

24. The machine of claim 20 further including:
a. a second counter which provides a second count
b. a second analog reference source which provides a second analog reference signal
c. means for initializing said second count to a second digital number value
d. means for causing said second count to change as a function of time
e. means for causing said second analog reference signal to change as a function of time
f. means for detecting when said second count reaches a second digital threshold value g. means for recording the value of said second analog reference signal as a second analog value when said second count reaches said second digital threshold value whereby said first analog value is the converted value of said first digital number value and whereby said second analog value is the converted value of said second digital number value.

25. The machine of claim 24 in which said first digital threshold value is the same as said second digital threshold value.

26. The machine of claim 25 in which said first digital threshold value is equal to zero.

27. A digital-to-analog converter comprising a first circuit element, wherein:
 a. said first circuit element is used in a first instance for a first conversion of a first digital number to a first analog value
 b. said first circuit element is used simultaneously in said first instance for a second conversion of a second digital number to a second analog value
 c. said first circuit element comprises a first parameter that varies with time during a conversion operation
 d. said first circuit element is a member of a set of circuit elements, said set of circuit elements consisting of a first counter and a first analog reference source whereby said first circuit element is effectively shared in said first conversion and in said second conversion, rather than used in said first instance for said first conversion and separately in a second instance for said second conversion, and whereby said first circuit element is not simply a constant reference signal.

28. The digital-to-analog converter of claim 27 in which said first circuit element is said first counter.

29. The digital-to-analog converter of claim 28, further including:
 a. a first digital comparator providing a first digital comparator output
 b. means for averaging said first digital comparator output over time whereby said digital-to-analog converter can implement shared parallel pulse-width modulation digital-to-analog conversion.

30. An analog-to-digital converter comprising the digital-to-analog converter of claim 27, whereby parallel analog-to-digital conversion of a multiplicity of analog values to a multiplicity of digital number values can share said first circuit element, such as parallel successive-approximation or half-flash analog-to-digital converters.

31. The digital-to-analog converter of claim 27 in which said first circuit element is said first analog reference source.

32. A machine used for digital-to-analog conversion, comprising:
 a. a first counter which provides a first count
 b. means for initializing said first count to a first digital number value
 c. means for causing said first count to change as a function of time
 d. means for detecting when said first count reaches a first digital threshold value
 e. means for averaging the output of said means for detecting when said first count reaches said first digital threshold value whereby the output of said means for averaging is the converted value of said first digital number value.

33. The machine of claim 32 in which said means for detecting when said first count reaches said a first digital threshold value is a first digital comparator.

34. The machine of claim 32 in which said first digital threshold value is zero, whereby no storage means are necessary to hold said first digital threshold value and whereby said means for detecting when said first count reaches said first digital threshold level can be implemented with simple digital logic such as a single multiple-input AND gate.

* * * * *